March 31, 1970 J. D. ROSS 3,504,288
ADJUSTABLE PULSE DELAY CIRCUITRY
Filed March 27, 1967
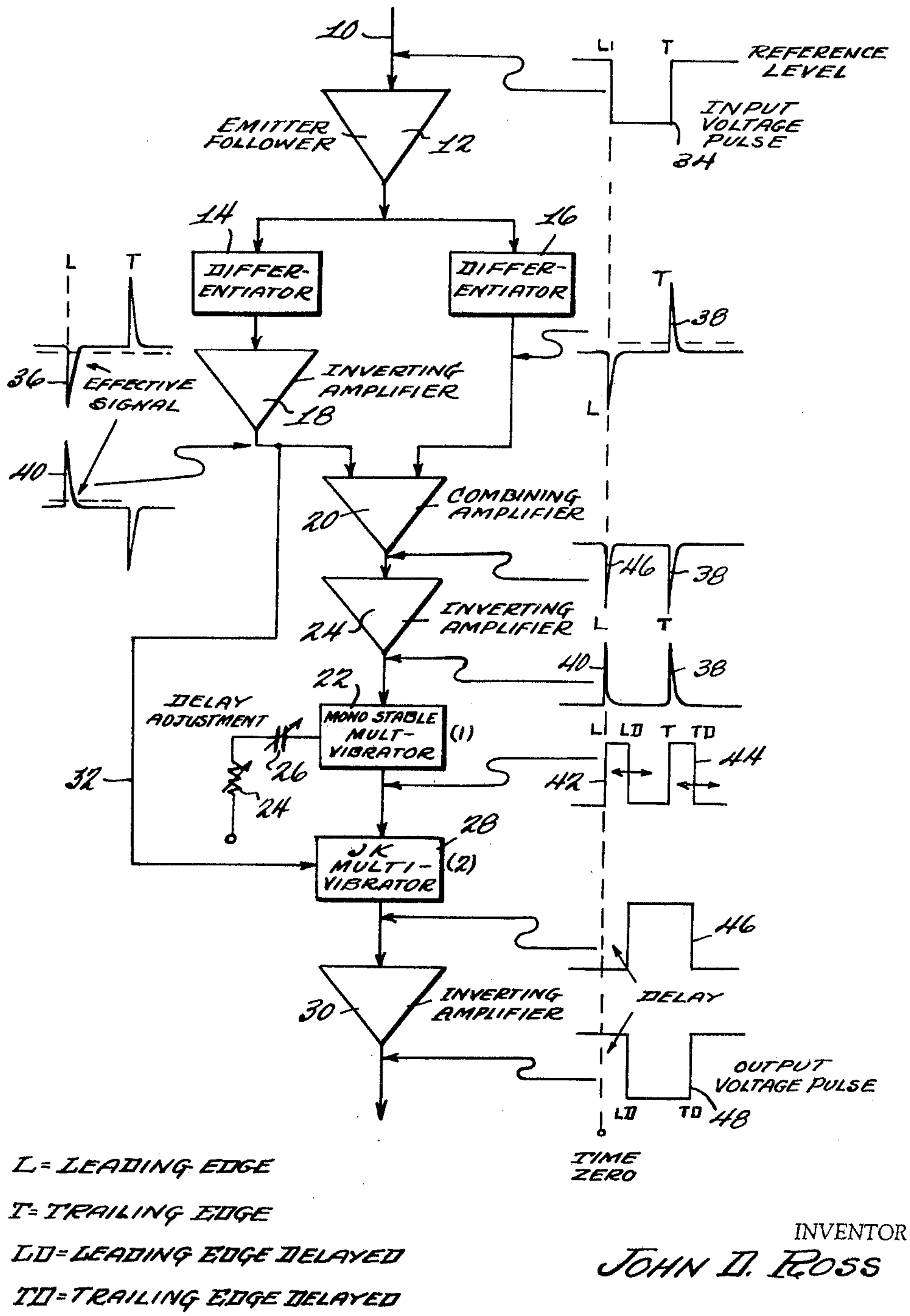
INVENTOR
JOHN D. ROSS
BY Gerald J. Ferguson Jr.
ATTORNEY

United States Patent Office 3,504,288

Patented Mar. 31, 1970

3,504,288

ADJUSTABLE PULSE DELAY CIRCUITRY

John D. Ross, Dollard des Ormeaux, Quebec, Canada, assignor to Central Dynamics, Ltd., Montreal, Quebec, Canada, a body corporate and politic Filed Mar. 27, 1967, Ser. No. 626,192

Int. Cl. H03k *1/00, 3/04*

U.S. Cl. 328—63 1 Claim

ABSTRACT OF THE DISCLOSURE

This invention employs digital circuits to delay a pulse signal by a continuously variable amount while insuring that the pulse width of the delayed signal remains unchanged. The constant pulse width is accomplished by employing a single monostable multivibrator circuit to generate the pulses which determine the leading and trailing edges of the delayed pulse.

This invention relates to pulse delay circuitry and, in particular, to pulse delay circuitry where the original pulse signal is delayed in time by a continuously variable amount with the original pulse width being substantially unaffected.

Among the prior art methods of accomplishing the above function are either some form of lumped constant delay line or a specific length of actual transmission line calculated to have the required delay. The main disadvantages of these prior art approaches are: (1) the extreme difficulty of designing lumped constant delay lines accurately for small delays; (2) the unweildiness of long transmission lines; (3) the inability to vary the delay time continuously; and (4) the introduction of signal deterioration.

Digital circuitry has also been employed in the prior art approaches for pulse delay purposes, such as that disclosed in Uunted States Patent 2,794,123, granted May 28, 1957 to Younker. However, the Younker delay circuitry is not concerned with maintaining the pulse width constant. The present invention does accurately maintain the pulse width of the signal originally applied to the pulse delay circuit. Hence, the shortcomings of the prior art pulse delay circuits are overcome.

It is a primary purpose of this invention to provide improved pulse delay circuitry wherein the pulse width of the signal applied thereto is accurately maintained.

It is a further object of this invention to provide improved pulse delay circuitry which delays the input signal by a continuously variable amount.

It is a further object of this invention to provide improved pulse delay circuitry wherein the output pulse rise time values are equal to or less than those of the original pulse applied to the circuitry.

It is a further object of this invention to provide improved pulse delay circuitry which comprises entirely solid state circuitry.

Other objects and advantages of this invention will become apparent upon reading the appended claims in conjunction with the following detailed description and the attached drawings, in which the sole figure of the drawing is a block diagram of a preferred illustrative embodiment of the invention showing typical waveforms occurring at different points of the embodiment.

Referring to the drawing, there is shown an input line 10 connected to emitter follower 12. Emitter follower 12 is connected to differentiators 14 and 16. Differentiators 14 and 16 are circuits of symmetrical design and have very short time constants compared to the width of the input signal applied thereto. The resistive arms (not shown) of the differentiators are respectively connected to a voltage source (not shown) in opposite polarities so that at differentiator 14, the sharp negative going pulse developed from the leading edge of the signal applied thereto becomes a first trigger signal and at differentiator 16, the sharp positive going pulse developed from the trailing edge of the signal applied thereto becomes a second trigger signal. The use of these trigger signals will be explained in detail hereinafter. Typically, the maximum width of the trigger pulses is 50 nanoseconds.

The output of differentiator 14 is connected to inverting amplifier 18 which typically contains one stage of amplification. Differentiator 16 and inverting amplifier 18 are connected to combining amplifier 20, which, in turn, is connected to monostable multivibrator 22 through inverting amplifier 24.

The pulse width of the output signal from multivibrator 22 is continuously variable in accordance with the settings of variable resistor 24 and/or variable capacitor 26. The output of multivibrator 22 is applied over single line 29 to bistable multivibrator flip-flop 28 which changes state in response to the trailing edge of each monostable multivibrator output signal applied thereto the multivibrator thus having only one trigger input. The JK flip-flop is a preferred type of multivibrator for use with this invention. The desired output appears at the output of inverting amplfier 30.

Inasmuch as the state of bistable multivibrator must be preestablished so that the phase of the signal at the output of inverting amplifier 30 properly corresponds with the phase of the input signal on line 10, line 32 is connected from the output of inverting amplifier 18 to the SET input of multivibrator 28, thereby insuring the proper phase correlation. Since the delay time through combining amplifier 20, inverter amplifier 24, and multivibrator 22 is substantially more than that along line 32, there is no danger of flip-flop 28 being actuated by two pulses at substantially the same time.

Having now described the circuit elements of the preferred illustrative embodiment of the improved pulse delay circuitry comprising this invention, a description of the operation thereof will now be given, referring to the signal waveforms shown in the drawing. Signal 34 has a rectangular waveshape, the duration of which is typically 2.5 microseconds minimum in application such as television. Pulse signal 34 is shown as a negative going voltage of rectangular shape. It, of course, will be obvious to those having ordinary skill in the digital circuitry art that the principles of this invention are applicable to other than negative going voltage pulses of rectangular shape, however, for the purpose of illustrating one embodiment of the invention, this particular waveform has been chosen.

When pulse signal 34 is applied to differentiator 14, a sharp negative going pulse or first trigger signal 36 developed from the leading edge of the signal 34 becomes an effective signal for initiating the desired delay interval signal whereas at differentiator 16, the sharp positive going pulse or second trigger signal 38 developed from the trailing edge of signal 34 becomes an effective signal for accurately maintaining the pulse width of the original signal 34.

The output of differentiator 14 is applied to inverting amplifier 18. Thus, two positive going pulses or first and second trigger signals 40 and 38 which respectively correspond to the leading and trailing edges of input signal 34 are applied to combining amplifier 20. After combination and inversion in combining amplifier 20 and inverting amplifier 24, the trigger pulses 40 and 38 sequentially trigger monostable multivibrator 22 with trigger pulse 40 occurring first in time. The monostable multivibrator 22 is triggered to its unstable state by pulse 40, thereby developing an output pulse signal 42, the width of which may be continuously adjusted in accordance with the settings of variable resistor 24 and/or variable capacitor 26. The width of signal 42 corresponds to the amount of delay introduced into signal 34 as will become more apparent hereinafter.

When trigger 38, corresponding to the trailing edge of signal 34, is applied to multivibrator 22, the multivibrator is again switched to its unstable state, thereby generating a second pulse signal 44. Since the width of pulse signal 42 corresponds to the delay of the input signal, it is obvious that the maximum delay obtainable is limited by the width of signal 34 because otherwise the pulse 38 would attempt to trigger multivibrator 22 while it was in the unstable condition resulting from triggering pulse 40. The minimum delay is limited by the propagation of time of the signals through the circuit components of the delay circuit. Typically the delay time may be varied over the range 200 nanoseconds to 1.5 microseconds for a pulse width of 2.5 microseconds of the delayed signal.

Signals 42 and 44 are sequentially applied to multivibrator 28. As has been explained hereinbefore, the initial phase of multivibrator 28 is established by trigger pulse 40 occurring at the output of inverting amplifier 18, this pulse being applied to the SET input of bistable multivibrator 28. Multivibrator 28 is responsive only to the negative going or trailing edges of pulses 42 and 44. Thus, when the negative going, trailing edge of pulse 42 is applied to multivibrator 28, it is RESET. The waveform of output signal 46 from multivibrator 28 undergoes a positive excursion when multivibrator 28 is RESET as shown in the drawing. Multivibrator 28 is SET again by the trailing edge of pulse 44.

After signal 46 is applied to inverter 30 to generate output signal 48, the desired delay of input signal 34 is completed. The delay corresponds exactly to the width of the pulse 42, the width of which is adjusted by components 24 and/or 26, thereby achieving a continuously variable delay of signal 34. To insure that the pulse width of signal 48 is the same as that of signal 34, the pulse width of signals 42 and 44 must be the same. Since these signals are generated by the same multivibrator 22, it necessarily follows that they will be the same, this being particularly true over the short time interval corresponding to the pulse width of input signal 34. In the Younker patent, mentioned hereinbefore, pulses corresponding to signals 42 and 44 are developed. However, this is done by two different multivibrators and, thus, the probability of maintaining the pulse width of the delayed signal constant from input to output of the delay circuitry is substantially reduced with respect to the approach employed in the instant invention.

Various modifications of the circuitry disclosed in the drawing will be apparent to those having ordinary skill in this art. For example, the emitter follower 12 may not be necessary, depending on the magnitude of the impedance of the input source. Further, inverting amplifier 30 may not be necessary if multivibrator 28 is appropriately preconditioned over line 32. Also inverting amplifier 24 may not be necessary depending on the type of bistable multivibrator 28 employed.

Still numerous other modifications of the invention will become apparent to one of ordinary skill in the art upon reading the foregoing disclosure. During such a reading, it will be evident that this invention has provided unique pulse delay circuitry for accomplishing the object and advantages herein stated. Still other objects and advantages, and even further modifications will be apparent from this disclosure. It is to be understood, however, that the foregoing disclosure is to be considered exemplary and not limitative, the scope of the invention being defined by the following claim.

What is claimed is:

1. Digital pulse circuitry for delaying an input pulse signal so that the width thereof remains substantially constant at the input and output of said pulse delay circuitry, said circuitry comprising:

a monostable multivibrator having two states of equilibrium, one of which is stable and the other of which is unstable, said monostable multivibrator including resistance and capacitance elements, the value of which can be varied to thereby vary the length of time said monostable multivibrator remains in its unstable state;

first differentiating means responsive to the leading edge of said input pulse signal for developing a first trigger signal;

means responsive to said first trigger signal for inverting the polarity thereof;

second differentiating means responsive to the trailing edge of said input pulse signal for developing a second trigger signal;

means for combining the output signal of said second differentiating means with the output signal of said polarity inverting means to thereby generate said first and second trigger signals sequentially in time;

said first trigger signal being applied to said monostable multivibrator to switch it to its unstable state for a length of time not exceeding the width of said input pulse signal thereby generating a first monostable multivibrator output pulse signal;

said second trigger signal being applied to said monostable multivibrator to switch it to its unstable state again thereby generating a second monostable multivibrator output pulse signal;

a bistable multivibrator being successively switched to alternate states of equilibrium by the trailing edges of said first and second monostable multivibrator output pulse signals thereby generating the delayed output signal, the delay of said input pulse signal corresponding to the length of time said monostable multivibrator is in its unstable state and the pulse width of said delayed output signal corresponding to the interval of time between the said trailing edges of said first and second monostable multivibrator output pulse signals;

means responsive to the output signal of said polarity inverting means for establishing the initial phase of said bistable multivibrator so that the delayed output signal will correspond in phase with the input pulse signal;

whereby the delay of said input pulse can be continuously varied by varying the value of either of said resistance or capacitance elements of said monostable multivibrator.

References Cited

UNITED STATES PATENTS 3,195,056 7/1965 Trautwein ........ 307—273 X
3,315,099 4/1965 Nishioka ......... 328—207 X

OTHER REFERENCES

Transistorized Circuits by Pressman, Fig. 11–7, pp. 11–296, copyright 1959 by John F. Rider Pub. Inc.

JOHN S. HEYMAN, Primary Examiner

U.S. Cl. X.R.

307—273, 293; 328—61, 127